United States Patent [19]

Stepp

[11] Patent Number: 4,668,910

[45] Date of Patent: May 26, 1987

[54] METHOD AND CIRCUIT FOR DETERMINING THE PRESENCE OR ABSENCE OF AT LEAST ONE FREQUENCY OF KNOWN VALUE IN AN INPUT SIGNAL COMPOSED OF SEVERAL FREQUENCIES

[75] Inventor: Richard Stepp, Munich, Fed. Rep. of Germany

[73] Assignee: Siemens Aktiengesellschaft, Berlin and Munich, Fed. Rep. of Germany

[21] Appl. No.: 912,207

[22] Filed: Sep. 24, 1986

Related U.S. Application Data

[63] Continuation of Ser. No. 661,812, Oct. 17, 1984, abandoned.

[30] Foreign Application Priority Data

Nov. 8, 1983 [DE] Fed. Rep. of Germany ....... 3340325

[51] Int. Cl.[4] ............................................. G01R 23/16
[52] U.S. Cl. ................. 324/77 B; 324/79 R; 328/14
[58] Field of Search ................ 324/77 R, 77 B, 79 R, 324/79 D, 78 Z, 78 Q, 78 N, 78 E, 78 F, 78 R, 78 D, 82; 328/14, 15, 18, 134, 140, 141; 358/257

[56] References Cited

U.S. PATENT DOCUMENTS

| | | | |
|---|---|---|---|
| 2,731,566 | 1/1956 | Chalhoub | 324/79 R |
| 2,911,641 | 11/1959 | Kohler | 324/79 D |
| 2,964,622 | 12/1960 | Fire | 324/79 R |
| 2,966,584 | 12/1960 | Isley | 324/79 R |
| 3,701,012 | 10/1972 | Lang | 324/79 R |
| 4,291,269 | 9/1981 | Nossen | 324/79 R |
| 4,318,045 | 3/1982 | Krupa | 328/14 |
| 4,320,531 | 3/1982 | Dimon | 328/15 |

OTHER PUBLICATIONS

CCIR Recommendation 599, Report 795-1, "Directivity of Antennas for the Reception of Sound Broadcasting in Band 8 (VHF)", 1978-1982, pp. 205-213.

Primary Examiner—Michael J. Tokar
Attorney, Agent, or Firm—Hill, Van Santen, Steadman & Simpson

[57] ABSTRACT

A method and circuit for determining the presence or absence of a frequency of known value in an input signal composed of several frequencies employ a frequency generator, to which a stable reference signal is supplied, for generating two switching signals having a frequency which is the same as the known frequency and a phase difference of 90°. The input signal is supplied to two mixers, to which the out-of-phase signals from the frequency generator are respectively supplied. The products of the two mixers are supplied to respective filters for filtering out ac components, and the respective amplitudes of the remaining dc voltage components of the respective mixed products are evaluated, the result of the evaluation indicating the presence or absence of the known frequency in the input signal.

24 Claims, 8 Drawing Figures

$|X|\vee|Y| > S$ $\sqrt{X^2+Y^2} > S$

METHOD AND CIRCUIT FOR DETERMINING THE PRESENCE OR ABSENCE OF AT LEAST ONE FREQUENCY OF KNOWN VALUE IN AN INPUT SIGNAL COMPOSED OF SEVERAL FREQUENCIES

This is a continuation of application Ser. No. 661,812, filed Oct. 17, 1984, now abandoned.

BACKGROUND OF THE INVENTION

1. Field of the Invention

The present invention relates to methods and devices for spectral analysis, and in particular to a method and circuit for determining the presence or absence of at least one frequency of known value in an input signal comprised of several different frequencies.

2. Description of the Prior Art

The necessity of determining the presence or absence of specific frequencies with a known value in an input signal comprised of several frequencies arises in decoding the program type recognition signal in a two-carrier television sound system. Details of such a two-carrier television sound system are described in CCIR Recommendation 599, Report 795-1, "Directivity of Antennas for the Reception of Sound Broadcasting in Band 8 (VHF)," 1978-1982, at pages 205-213. As described therein, program type recognition in the case of a two-carrier television sound system proceeds with the use of an amplitude-modulated pilot carrier tone. The frequency of the pilot carrier tone is equal to 3.5 times the video line frequency $f_H$. For the stereo and two tone operating modes, an identifying tone is modulated on the pilot carrier tone. The possible operating modes are schematically represented in FIGS. 1A-1D in the form of a frequency spectrum.

The stereo operating mode is shown in FIG. 1A in which an identifying tone with the frequency of 15,625/133 Hz is modulated, by amplitude modulation, onto a pilot tone carrier, whose frequency is references $f_p$, which has a frequency of $3.5 \times 15,625$ Hz. The value of 15,625 Hz is the video line frequency $f_H$. In FIG. 1A, the side bands are identified at $f_{+s}$ and $f_{-s}$, respectively.

The two tone operating mode is shown in FIG. 1B wherein an identifying tone with a frequency of 15,625/57 Hz is modulated onto the pilot carrier tone having a frequency referenced $f_p$. The side bands in this mode are identified at $f_{+z}$ and $f_{-z}$, respectively.

The mono operating mode is shown in FIG. 1C in a two-carrier television sound system in which only the pilot carrier tone having a frequency $f_p$ is present, and on which no identifying tone is modulated.

Lastly the conventional mono operating mode is shown in FIG. 1D in the case of present-day conventional television transmission in which the pilot carrier tone is not present.

The modulation degree in the case of the operating modes shown in FIGS. 1A and 1B is 50%.

Transmission of the above-explained amplitude modulated frequency proceeds from a television transmitter such that the amplitude-modulated pilot carrier tone is modulated, by frequency modulation, on a carrier in the megahertz range. In the television receiver, an initial frequency demodulation and a subsequent amplitude demodulation are conducted for obtaining the identifying tones. Evaluation of the information identifying the operating modes mono, two-tone, and stereo can proceed via the upper or lower side band. Evaluation of either side band is equivalent.

In conventional systems, decoding of the program type recognition in a two carrier television sound system is conducted by means of synchronous or envelope detection of the modulated pilot carrier tone with a subsequent evaluation of the demodualted identifying tone.

In transmission of television information, due to cross-modulation effects, interfering frequencies from the video component of the television information may result which are identical to the frequency of the pilot carrier tone. These interfering frequencies may be so strong that corresponding fluctuations of the pilot carrier tone amplitude, and hence undesired interference frequencies, occur after the amplitude demodulation.

SUMMARY OF THE INVENTION

It is an object of the present invention to provide a method and circuit for determining the presence or absence of frequencies of known value in a signal comprised of a plurality of frequencies.

It is a further object of the present invention to provide such a method and apparatus for determining the presence or absence of identifying tones in a two-carrier television sound system wherein carrier intereferences do not enter into the determination.

The above objects are inventively achieved in a method and circuit wherein a stable reference frequency is supplied to a frequency generator which generates two switching signals having a frequency which is the known frequency, but being 90° out-of-phase. The two switching signals are supplied to respective mixers, to which the input signal comprised of a number of frequencies is also supplied. The mixed products from each mixer are then supplied to respective filters for filtering out the ac components. The respective remaining dc components are supplied to respective amplitude evaluators, which evaluate the amplitude of the dc components utilizing one of several evaluation techniques for identifying the presence or absence of the known frequency in the input signal.

DESCRIPTION OF THE PREFERRED EMBODIMENTS

Figure 2:
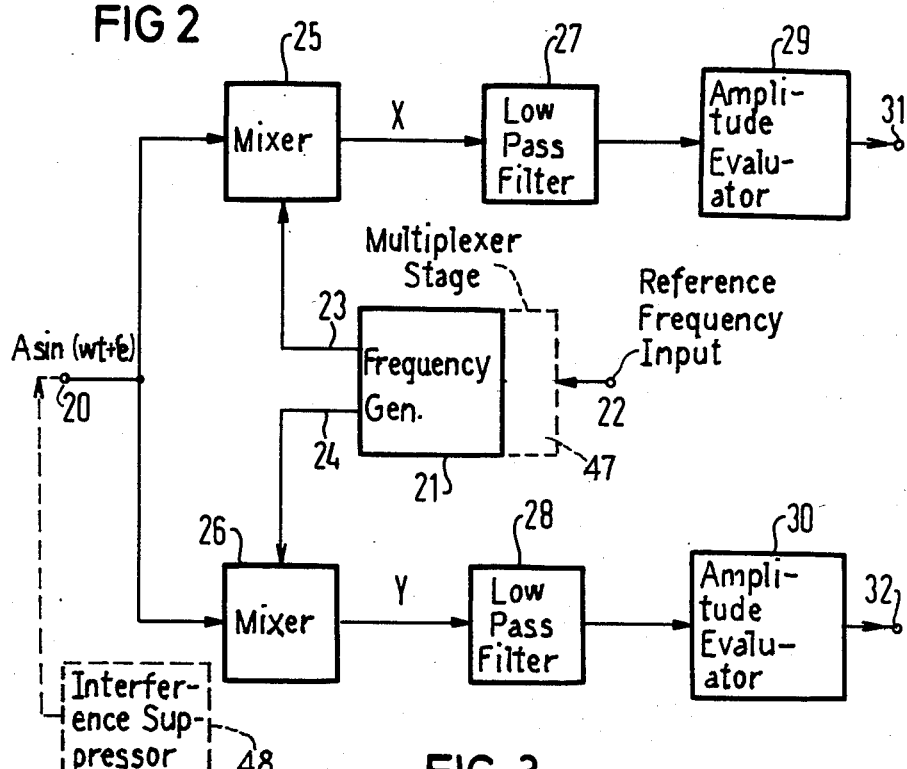
FIG. 2 is a block circuit diagram for a circuit for determining the presence of a known frequency in an input signal comprised of a number of frequencies constructed in accordance with the principles of the present invention and operating in accordance with the principles of the method disclosed herein.

A circuit for determining the presence or absence of a known frequency in an input signal comprised of a plurality of frequencies, operating in accordance with the method disclosed and claimed herein is shown in FIG. 2. The circuit is supplied with an input signal at 20 of the form $A \sin(\omega t + \epsilon)$ wherein A signifies the amplitude of the signal, $\omega$ signifies the frequency of the signal, t represents time, and $\epsilon$ signifies the phase of the signal.

A stable reference frequency is supplied at an input 22 to a frequency generator 21. The frequency generator 21 generates two output signals at respective lines 23 and 24 each having a frequency which is the same as the known frequency, that is, the frequency in question, and a phase difference of 90°. In the case of a two-carrier television sound system, the stable reference frequency is preferably the video line frequency $f_H$, which is available in the video signal. Generally, however, any other stable frequency may be employed as the reference frequency, which may be generated, for example, by a (non-illustrated) quartz-controlled oscillator.

The input signal supplied at 20 is fed into respective inputs of linear mixers 25 and 26, to which the outputs 23 and 24 of the frequency generator are also supplied. The mixers 25 and 26 undertake a multiplicative mixture, in a manner known to those skilled in the art, of the input signal with the respective switching signal. If the frequencies of the input signal and the two switching signals are identical, the mixers will deliver only a dc voltage component X or Y at their respective outputs. The voltage components X and Y will be respectively proportional to the amplitude A and the phase angle $\epsilon$ of the input signal. Specifically, X is proportional to $A \sin \epsilon$ and Y is proportional to $A \cos \epsilon$.

The input signal must be evaluated in the two channels with the switching signal because the phase of the input signal may be random, that is, the phase may be any angle within the range of 0° through 90° (or a multiple thereof with the factor 180°), thus the dc voltage components, according to the above proportionality equations, could disappear in the case of an evalution in only one channel. Low pass filters 27 and 28 are respectively connected to the outputs of the mixers 25 and 26 for filtering out ac components in the output signal of the mixers. The low pass filters 27 and 28 have a cut-off frequency of several hertz, preferably 2 Hz at a maximum. The low pass fitlers 27 and 28, with respect to the signal at the input 20, function as a band pass filter with the medium frequency equal to the switching frequency of the two switching signals supplied on lines 23 and 24 and a band width equal to twice the low pass fitler cut-off frequency. Accordingly, only the dc components X and Y will be present at the outputs of the low pass filters, given identity of the frequency of the signal at the input 20 and the frequency of the switching signals on the lines 23 and 24.

The output signals of the low pass filters 27 and 28 are supplied to respective amplitude evaluators 29 and 30, wherein the amplitude of the respective dc voltage components X and Y are evaluated. Evaluation of these amplitudes for determining the presence or absence of a frequency of the known value in the input signal is sufficient, because the phase $\epsilon$ of the input signal is arbitary.

Amplitude evaluation can be undertaken in the evaluators 29 and 30 according to a number of techniques.

Figure 4A:
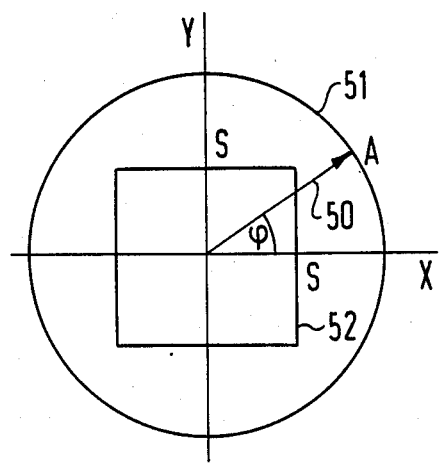
FIGS. 4A and 4B are schematic diagrams for explaining the evaluation of dc voltage components for the purpose of determining the presence of a known frequency in an input signal in accordance with the principles of the present invention.

In a first embodiment, the amplitude evaluators 29 and 30 may be threshold value switches of the type known to those skilled in the art which determine whether the absolute values of the dc voltage components X and Y are larger than a specified threshold S. This type of amplitude evaluation is illustrated in the diagram shown in FIG. 4A. The dc voltage component in that diagram is again indicated by an amplitude A and a phase angle $\epsilon$, such that the dc voltage component can be represented by a vector 50 which may lie, dependent upon the random angle $\epsilon$, on a circle 50. The amplitude evaluators 29 and 30 as shown in FIG. 2 in the threshold value switches, respond to a threshold value S which is defined by the limiting square 52 in FIG. 4A having sides of length S. If the vector for the dc voltage component having an amplitude A is outside of the square 52, a signal is supplied to the respective outputs 31 and 32 of the evaluators 29 and 30 indicating the presence of the known frequency. This is indicated by the expression at the bottom of FIG. 4A.

Figure 4B:
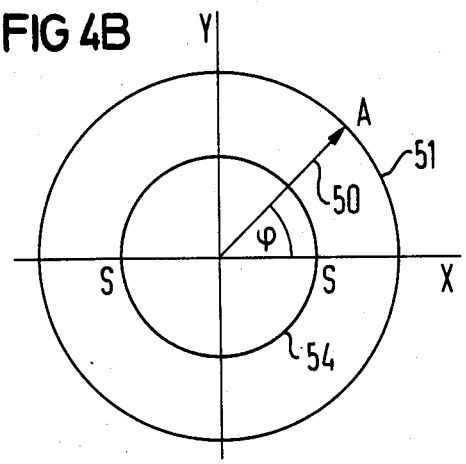

Another technique for evaluating the dc voltage components X and Y undertakes a determination of the square root of the sum of the squares of those components by conventional electronic elements, and ascertaining whether the value of the square root is greater than a selected threshold value S. This technique is schematically illustrated in FIG. 4B which corresponds to the diagram shown in FIG. 4A except that the square root of the sum of the squares of the values X and Y is a circle 54, instead of the square 52.

Figure 3:
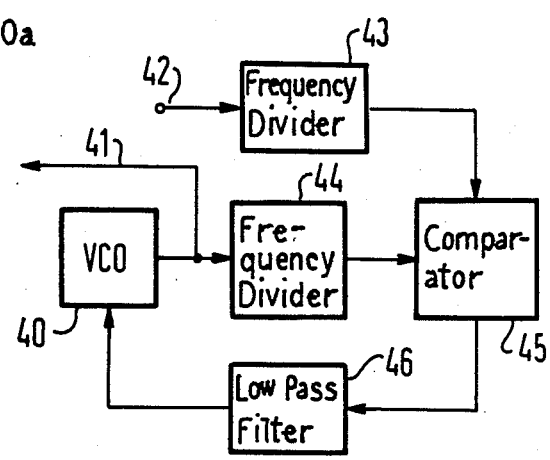
FIG. 3 is a block circuit diagram for an embodiment of the frequency generator shown in the circuit in FIG. 2.

An embodiment for generating the switching signals supplied to the mixers 25 and 26 at the outputs 23 and 24 of the frequency generator 21 is shown in FIG. 3 in the form of a phase locked loop. A voltage controlled oscillator 40 oscillates at the known frequency of the switching signals, and has an output supplied via line 41 to one of the lines 23 or 24. The stable reference frequency is supplied to the input 42 in the embodiment shown in FIG. 3. The input 42 leads to a frequency divider 43, and the output of the voltage controlled oscillator 40 is supplied to another frequency divider 44. The phases of the output signals of the frequency dividers 43 and 44 are compared with each other in a comparitor 45, with the output signal of the phase comparitor 45 being supplied to the control input of the voltage controlled oscillator 40 through a low pass filter 46, as a consequence of which a frequency control takes place.

For generating the two switching signals phase shifted by 90°, the output 41 of the phase locked loop shown in FIG. 3 can be branched into two lines, and a phase shifter can be provided in one of the branches which shifts the output signal by 90° in phase. Such a phase shifter is known to those skilled in the art and is not separately shown in FIG. 3.

Figure 1A:
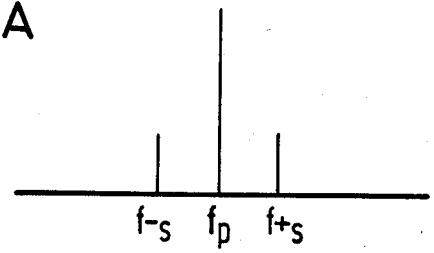
FIGS. 1A, 1B, 1C and 1D schematically represent frequency spectrums of various operating modes of television sound systems.
Figure 1B:
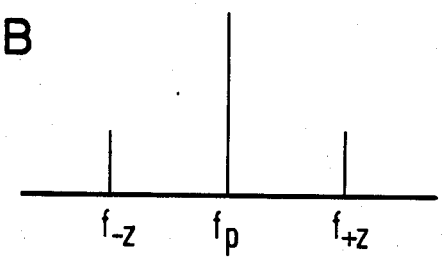
Figure 1C:
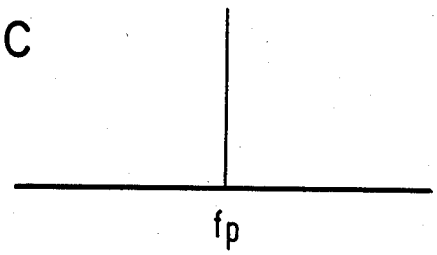
Figure 1D:

For determining the presence or absence of several frequencies of known values, for example, of different side band frequencies according to FIGS. 1A and 1B, evaluation can be undertaken in a number of parallel channels, with each channel including a circuit as shown in FIG. 2. Alternatively, a single circuit of the type shown in FIG. 2 can be utilized employing a multiplexer means such as, for example, a multiplexer stage 47 in the frequency generator 21, with successive pairs of switching signals appearing on lines 23 and 24 having different frequencies corresponding to the frequencies in question in the input signal.

If the input signal is transmitted in an environment which subjects the input signal to substantial disturbance or interference, evaluation of the signal can be improved by known interference suppressing means, for example, by integration methods and by statistical evaluations. Means for conducting such interference suppression may be interconnected at any suitable point in the circuit shown in FIG. 2, such as an interference suppressor 48 connected to the input 20, to which the input signal is supplied at an input 20a.

Although other modification and changes may be suggested by those skilled in the art it is the intention of the inventor to embody within the patent warranted hereon all changes and modifications as reasonable and properly come within the scope of his contribution to the art.

I claim as my invention:

1. A method for identifying the presence or absence of a plurality of frequencies of known values in an input signal composed of a plurality of frequencies comprising the steps of:
- generating a plurality of pairs of switching signals from a reference frequency for each of said frequencies in said plurality of known frequencies, said switching signals in each pair having the same frequency as one of said frequencies of known values and being out-of-phase by 90°;
- separately mixing said input signal with each of said switching signals;
- filtering the result of each mixing for removing ac components from said result leaving respective dc components having an amplitude of a magnitude dependent upon the presence of said frequencies of known values in said input signal; and
- evaluating the respective amplitudes of said dc components for determining the presence of said frequencies of known values.

2. A method as claimed in claim 1 wherein said input signal is a pilot tone carrier having characteristic frequencies modulated thereon in a two-carrier television sound system, and wherein said reference frequency is the video line frequency for the sound system, and wherein said switching signals have a frequency equal to at least one of said characteristic frequencies.

3. A method as claimed in claim 1 wherein the step of filtering is further defined by subjecting the result of each mixing to low-pass filtering.

4. A method as claimed in claim 3 wherein said low pass filtering has a cut-off frequency which is less than 2 Hz.

5. A method as claimed in claim 1 wherein the step of evaluating the respective amplitudes of said dc components is further defined by comparing the absolute values of said dc components with a selected threshold.

6. A method as claimed in claim 1 wherein the step of evaluating the respective amplitudes of said dc components is further defined by the steps of formulating the square root of the sum of the squares of said dc components and comparing said square root to a threshold value.

7. A method as claimed in claim 1 wherein the steps of generating said plurality of pairs of switching signals, separately mixing said input signal with each of said switching signals, filtering the result of each mixing, and evaluating the respective amplitudes of said dc components proceed in a plurality of parallel separate channels for each of said pairs of switching signals.

8. The method of claim 1 comprising the additional step of multiplexing said pairs of switching signals and successively separately mixing said input signal with each of said pairs of switching signals.

9. A method as claimed in claim 1 comprising the additional step of subjecting said input signal to intereference suppression before mixing said input signal with said switching signals.

10. A method as claimed in claim 9 wherein the step of subjecting said input signal to interference suppression is further defined by subjecting said input signal to a selected number of integrations.

11. A method as claimed in claim 9 wherein the step of subjecting said input signal to interference suppression is further defined by statistically evaluating said input signal for suppressing interferences.

12. A circuit for identifying the presence or absence of at least one frequency of a known value in an input signal composed of a plurality of frequencies comprising:
  a frequency generator supplied with a reference frequency and generating two switching signals each having the same frequency as said frequency of known value in said input signal and being out-of-phase by 90°;
  two mixers having respective inputs connected to said frequency generator for receiving said switching signals therefrom, and each mixer having an additional input to which said input signal is supplied;
  two filters connected to the respective outputs of said mixers for filtering out ac components of the outputs of said mixers leaving respective dc components having an amplitude of a magnitude dependent upon the presence of said frequency of known value in said input signal; and
  two amplitude evaluators connected to the respective outputs of said filters for evaluating the respective amplitudes of said dc components for determining the presence of said frequency of known value.

13. A circuit as claimed in claim 12 wherein said reference frequency is supplied by a quartz-controlled oscillator.

14. A circuit as claimed in claim 12 wherein said input signal is a signal from a two-carrier television sound system, and wherein said reference frequency is the video line frequency of siad system.

15. A circuit as claimed in claim 12 wherein said frequency generator is a phase locked loop circuit.

16. A circuit as claimed in claim 12 wherein said filters are low pass filters.

17. A circuit as claimed in claim 16 wherein said low pass filters have a cut-off frequency which is less than 2 Hz.

18. A circuit as claimed in claim 12 wherein said amplitude evaluators are threshold value switches having a selected switching threshold.

19. A circuit as claimed in claim 12 wherein each of said amplitude evaluators forms the square root of the sum of the squares of said dc components and compares said square root with a selected threshold value.

20. A circuit as claimed in claim 12 for identifying the presence or absence of a plurality of frequencies of known values in said input signal comprising a plurality of channels each having a frequency generator, two mixers, two filters and two amplitude evaluators, each frequency generator generating switching signals having a frequency equal to one of said plurality of frequencies of known value.

21. A circuit as claimed in claim 12 for identifying the presence or absence of a plurality of frequencies of known values in said input signal wherein said frequency generator includes a multiplexer stage, said frequency generator generating a plurality of successive pairs of switching signals, each pair of switching signals having a different frequency equal to one of said plurality of frequencies of known value.

22. A circuit as claimed in claim 12 further comprising an interference suppressor to which said input signal is supplied before being supplied to said mixers.

23. A circuit as claimed in claim 22 wherein said interference suppressor is at least one integrator circuit.

24. A circuit as claimed in claim 22 wherein said interference suppressor is a statistical evaluation circuit.

* * * * *